United States Patent [19]

Ito

[11] Patent Number: 5,604,655
[45] Date of Patent: Feb. 18, 1997

[54] SEMICONDUCTOR PROTECTION CIRCUIT AND SEMICONDUCTOR PROTECTION DEVICE

[75] Inventor: Takao Ito, Tokyo, Japan

[73] Assignee: Kabushiki Kaisha Toshiba, Kawasaki, Japan

[21] Appl. No.: 302,998

[22] Filed: Sep. 12, 1994

[30] Foreign Application Priority Data

Sep. 17, 1993 [JP] Japan .................................. 5-230678

[51] Int. Cl.$^6$ .............................................. H02H 9/00
[52] U.S. Cl. .................................. 361/56; 361/111
[58] Field of Search ........................... 361/56, 91, 111; 257/355–363

[56] References Cited

U.S. PATENT DOCUMENTS 4,385,337 5/1983 Asano et al. ............................ 361/91

FOREIGN PATENT DOCUMENTS 2-290052 11/1990 Japan .

*Primary Examiner*—Jeffrey A. Gaffin
*Assistant Examiner*—Michael J. Sherry
*Attorney, Agent, or Firm*—Finnegan, Henderson, Farabow, Garrett & Dunner, L.L.P.

[57] ABSTRACT

A semiconductor protection circuit for protecting an internal circuit from a surge voltage comprises a depletion type PMOS transistor in which its drain is connected to the input/output terminal of the internal circuit. The control terminal is connected to the gate of the PMOS transistor. The control terminal applies a high voltage or low voltage to the gate in accordance with the ON or OFF state of the power of the internal circuit. When the high or low voltage is applied to the gate, the channel of the PMOS transistor is rendered non-conductive or conductive, respectively. The source of the PMOS transistor is grounded via a PN diode and a junction capacitor provided parallel. When a negative surge voltage is applied, the diode is rendered conductive, thereby protecting the internal circuit. When a positive surge voltage is applied, the diode is broken down, thereby protecting the internal circuit. The surge voltage is made small by the capacitor's static capacitance. When the control terminal is in a high potential state, the channel of the PMOS transistor disappears. Therefore, the internal circuit is released from the diode and capacitor. Consequently, during operation of the internal circuit, the parasitic capacitance at the input/output terminal is reduced.

6 Claims, 4 Drawing Sheets

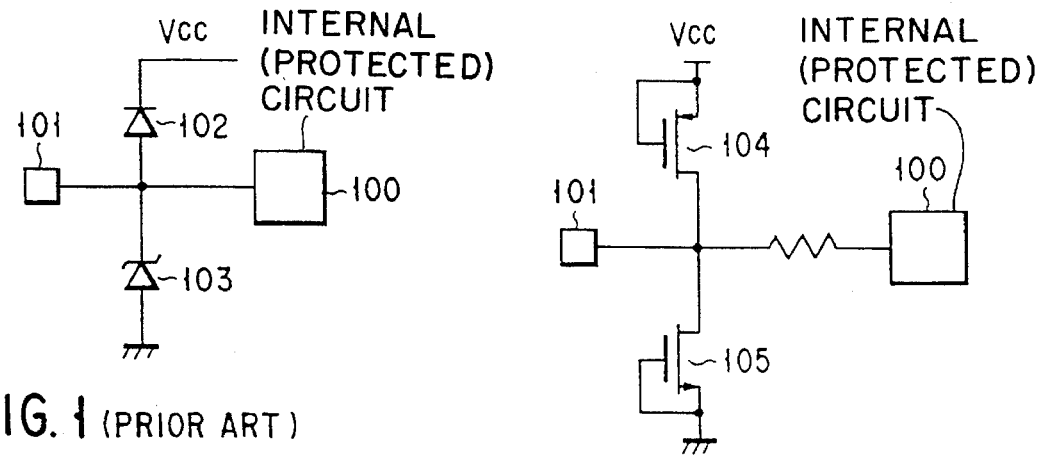
FIG. 1 (PRIOR ART)
FIG. 2 (PRIOR ART)
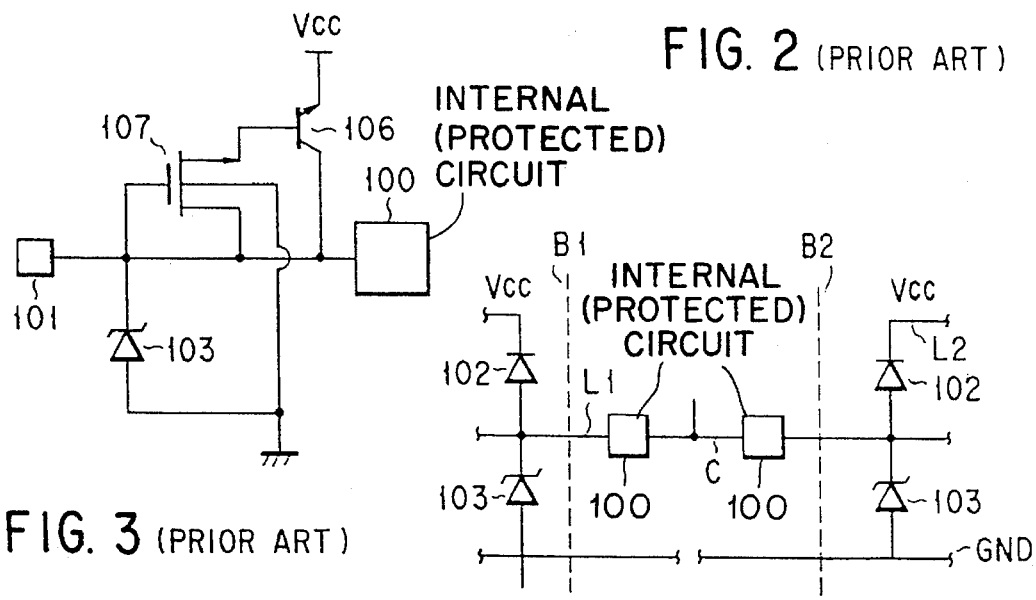
FIG. 3 (PRIOR ART)
FIG. 5 (PRIOR ART)
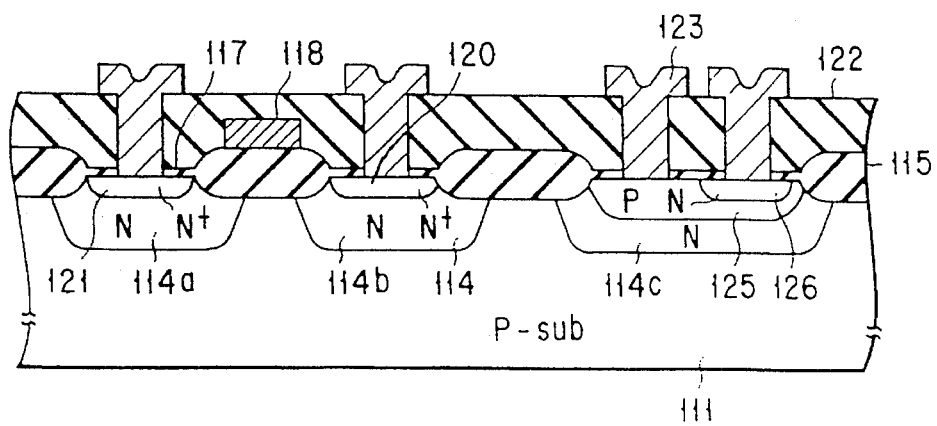
FIG. 4 (PRIOR ART)

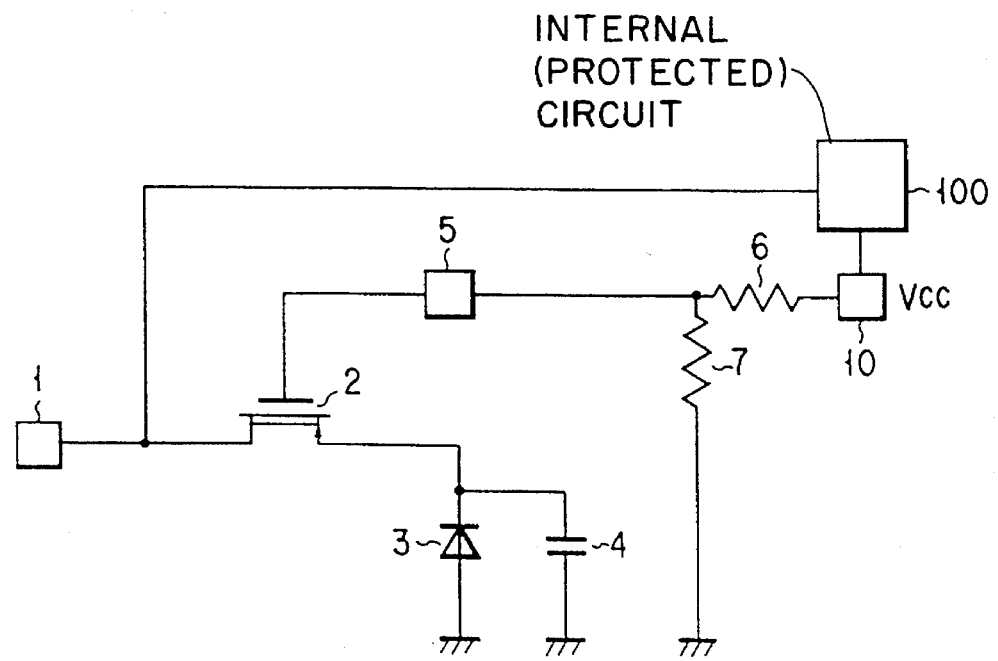
F I G. 6
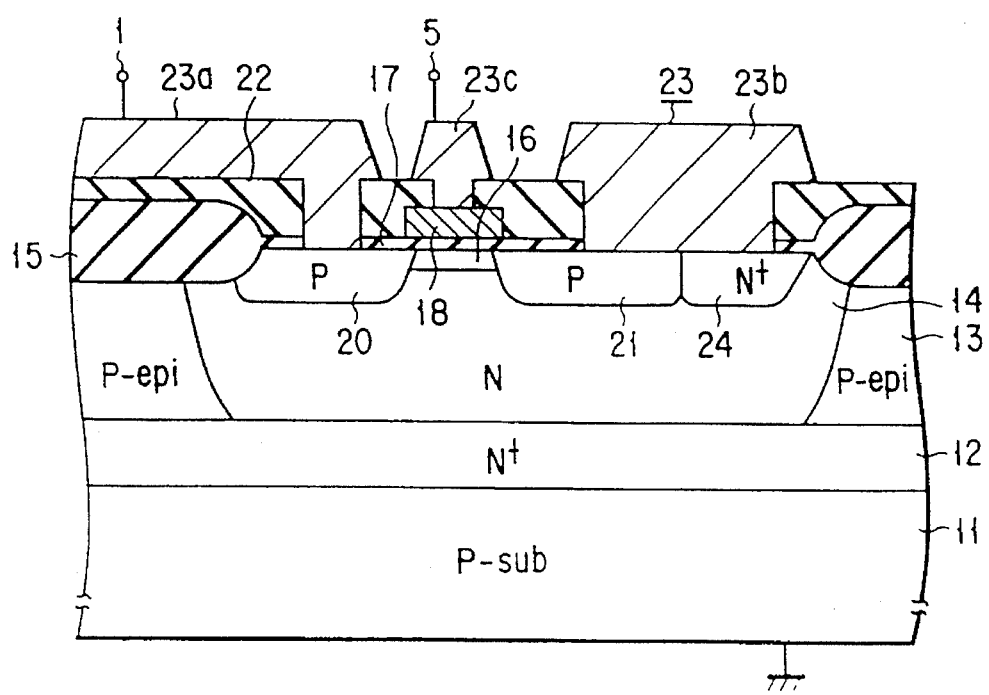
F I G. 7

SEMICONDUCTOR PROTECTION CIRCUIT AND SEMICONDUCTOR PROTECTION DEVICE

BACKGROUND OF THE INVENTION

1. Field of the Invention

The present invention relates to a semiconductor protection circuit and a semiconductor protection device, more specifically to those designed to protect a main semiconductor device from a surge voltage applied to an input/output terminal for a high-frequency signal, from outside.

2. Description of the Related Art

Semiconductor protection circuits generally used are shown in FIGS. 1, 2 and 3.

In the circuit shown in FIG. 1, between an internal circuit 100 and its input/output terminal 101, a power source Vcc (maximum potential) is connected via a PN diode 102, and so is a minimum potential (ground) via a Schottkey diode. A cathode of the PN diode 102 is connected to the power source vcc, and an anode is connected to the input/output terminal 101. Further, a cathode of the Schottkey diode 103 is connected to the input/output terminal 101, and an anode is connected to the minimum potential.

According to the circuit shown in FIG. 1, in the case where a positive surge potential higher than Vcc (maximum potential) is applied to the input/output terminal 101, the PN diode 102 is rendered conductive, thereby protecting the internal circuit 100. In the case where a negative surge potential lower than the minimum potential is applied to the input/output terminal 101, the Schottkey diode 103 is rendered conductive, thereby protecting the internal circuit 100.

In the circuit shown in FIG. 2, between an internal circuit 100 and its input/output terminal 101, a power source Vcc (maximum potential) is connected via a PMOS transistor 104, and so is a minimum potential (ground) via an NMOS transistor 105. Drains of both MOS transistors 104 and 105 are connected to the input/output terminal 101, and gates and sources are connected to the power source Vcc or the minimum potential.

According to the circuit shown in FIG. 2, in the case where a positive surge potential is applied to the input/output terminal 101, the PMOS transistor 104 is rendered conductive, thereby protecting the internal circuit. In the case where a negative surge potential is applied to the input/output terminal 101, the NMOS transistor 105 is rendered conductive, thereby protecting the internal circuit 100.

In the circuit shown in FIG. 3, a bipolar transistor is provided in order to help a MOS transistor having a low current driving property. Between an internal circuit 100 and its input/output terminal 101, a power source Vcc (maximum potential) is connected via an NPN bipolar transistor 106, and so is a minimum potential (ground) via a Schottkey diode 103. An emitter of the bipolar transistor 106 is connected to the power source Vcc, and a collector is connected to the input/output terminal. A cathode of the Schottkey diode 103 is connected to the input/output terminal 101, and an anode is connected to the minimum potential. Further, a source of an NMOS transistor 107 is connected to a base of the bipolar transistor 106. A gate and a drain of the MOS transistor 107 are connected to the input/output terminal 101.

According to the circuit shown in FIG. 3, in the case where a positive surge potential is applied to the input/output terminal 101, the NPN bipolar transistor 106 is rendered conductive, thereby protecting the internal circuit. In the case where a negative surge potential is applied to the input/output terminal 101, the Schottkey diode 103 is rendered conductive, thereby protecting the internal circuit 100.

Next, the structure of a conventional semiconductor protection device will be described with reference to FIG. 4. FIG. 4 is a cross sectional view of a structure in which the protection circuit shown in FIG. 3 is realized on a semiconductor substrate, including the NPN bipolar transistor 106 and the NMOS transistor 107.

N-type well layers 114a, 114b and 114c are formed in the surface region of a P-type semiconductor substrate, and an oxide film 115 is selectively formed on the substrate 111 such as to surround these layers. A thin oxide film 117 is formed on the N-type well layers 114a, 114b and 114c so as to protect the surface of the substrate 111.

A polysilicon gate electrode 118 is provided between the N-type well layers 114a and 114b, which serve as the drain and source of the NMOS transistor 107, on the oxide film. High-concentration N-type layers 121 and 120 are formed in the surface regions of the N-type well layers 114a and 114b. Further, a P-type base layer 125 is formed in the surface region of the N-type well layer 114c which serves as the collector of the NPN bipolar transistor 106 and an N-type emitter layer 126 is formed in the surface region of the base layer.

An $SiO_2$ insulation film 122 is deposited on the substrate 111 by the CVD. Contact holes are formed in the insulation film 122, and electrodes 123 are provided in these holes.

The conventional protection circuits share a common problem in which a large parasitic capacitance of the protection circuit is assigned to the input/output terminal, where high-frequency signals pass by, thus reducing the signal charge. Therefore, in order to achieve a high frequency characteristic, a protection circuit cannot be provided. As a result, the reliability as regards static breakage must be inevitably deteriorated. Apart from this, the conventional circuits entail the drawbacks described below.

FIG. 5 illustrates an example in which two protection circuits such as shown in FIG. 1 are provided on boards B1 and B2, which are connected to each other via a connection cord C. In this case, in the case where the power voltage of the circuit of the board B1 is maintained at the regular operation level while the power of the circuit on the board B2 is turned off, thus reducing the potential at the position L2 to the GND level, the PN diode 102 of the board B2 is turned on since the output voltage of the board B1 (the potential at the position L1 in the figure) is at a high level. Thus, an undesired current flows from the position L1 to the position L2, causing a loss of the signal charge applied to the input/output terminal.

Further, in the case where a bipolar transistor and an MOS transistor are provided as shown in FIG. 4, in order to avoid the damage to circuit due to the concentration of the breakdown current, the area occupied by the entire protection device is increased, raising another drawback in terms of high degree of integration.

SUMMARY OF THE INVENTION

The present invention has been proposed in consideration of the above drawbacks, and an object thereof is to provide a semiconductor protection circuit and a protection device, which can reduce the loss in signal charge due to the parasitic capacitance and can be used in a device handling high-frequency signals.

Another object is to provide a semiconductor protection circuit and a protection device which do not occupy a large area.

According to a first aspect of the present invention, there is provided a semiconductor protection circuit for protecting a main semiconductor device from a surge voltage, comprising: a depletion-type MOS transistor, one of a source and a drain of which is connected to an input/output terminal of the main semiconductor device; a control terminal connected to a gate of the depletion-type MOS transistor, the control terminal applying one of first and second potentials, selected in accordance with switching between an operation state and a non-operation state of the main semiconductor device, to the gate, and the first and second potentials rendering a channel of the depletion-type MOS transistor non-conductive or conductive, respectively; a first bypass for releasing a surge current when a surge voltage of a first polarity is applied to the input/output terminal; a second bypass for releasing a surge current when a surge voltage of a second polarity, which is opposite to the first polarity, is applied to the input/output terminal; and semiconductor rectifying means for connecting the other of the source and drain of the depletion-type MOS transistor to the first and second bypasses.

According to a second aspect of the present invention, there is provided a semiconductor protection device for protecting a main semiconductor device from a surge voltage, comprising: a semiconductor substrate having an active layer of a first conductivity type; a high impurity concentration buried layer of a second conductivity type, formed on the active layer, the active layer and the buried layer forming a junction capacitor; a well layer of the second conductivity type, formed on and electrically connected to the buried layer; a depletion-type MOS transistor having a source layer, a channel region and a drain layer of the first conductivity type, formed in a surface of the well layer, and a gate electrode formed on the channel region via an insulation film; an electrode and wiring layer for connecting one of the source and drain layers to the input/output terminal of the main semiconductor device; a control terminal connected to the gate electrode via an electrode and wiring layer, the control terminal applying one of first and second potentials, selected in accordance with switching between an operation state and non-operation state of the main semiconductor device, to the gate electrode, and the first and second potentials rendering the channel region non-conductive and conductive, respectively; an electrode and wiring layer for short-circuiting the other of the source layer and drain layer with the well layer; and a semiconductor rectifying element formed on the substrate, for connecting the well layer to a bypass used for releasing a surge current when a surge voltage is applied to the input/output terminal.

According to the present invention, when the main semiconductor device, that is, the internal circuit, is in a non-operation state, the channel of the depletion-type MOS transistor is rendered conductive. Consequently, the rectifying means having a large equivalent parasitic capacitance is connected to the input/output terminal. Therefore, the static breakage can be prevented, increasing a reliability. On the other hand, when the internal circuit is in an operation state, the channel of the depletion-type MOS transistor disappear. Consequently, the rectifying means is separated from the input/output terminal. Thus, the parasitic capacitance of the input/output terminal is significantly reduced, improving the high-frequency characteristic of the internal circuit.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a diagram showing a conventional semiconductor protection circuit;

FIG. 2 is a diagram showing another conventional semiconductor protection circuit;

FIG. 3 is a diagram showing still another conventional semiconductor protection circuit;

FIG. 4 is a cross sectional view showing a semiconductor protection device corresponding to the circuit shown in FIG. 3;

FIG. 5 is an explanatory diagram illustrating the problems entailed in the conventional semiconductor circuits;

FIG. 6 is a semiconductor protection circuit according to an embodiment of the present invention;

FIG. 7 is a cross sectional view showing a semiconductor protection device corresponding to the circuit shown in FIG. 6;

Detailed Description of the Preferred Embodiments

Figure 8:
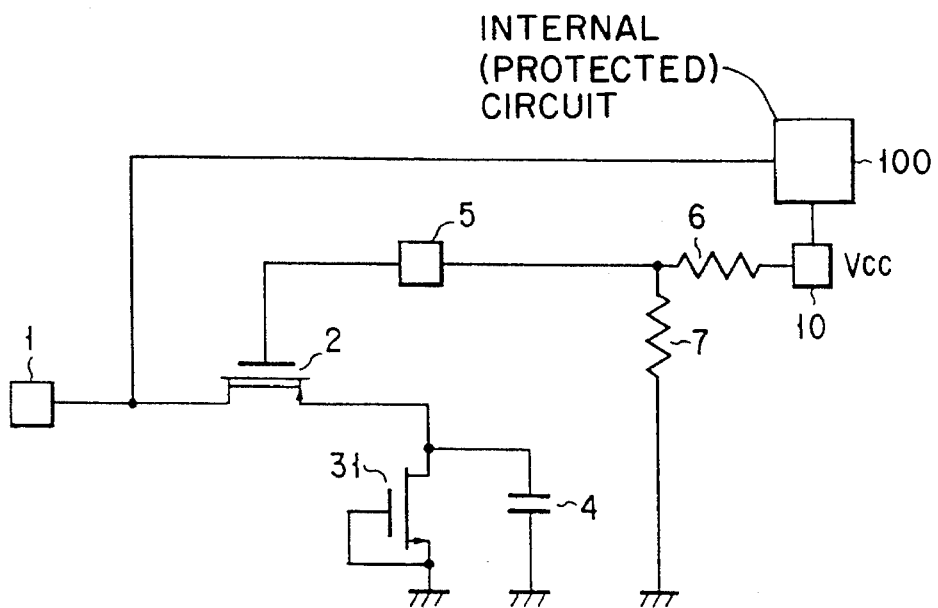
FIG. 8 is a semiconductor protection circuit according to another embodiment of the present invention.

As shown in FIG. 6 showing a semiconductor protection circuit according to an embodiment of the present invention, the drain of a depletion-type PMOS transistor 2 is connected to a node between an internal circuit 100, serving as the main semiconductor device, and an input/output terminal 1. The gate of a PMOS transistor 2 is connected to a control terminal 5, and the source thereof is connected to the cathode of a PN diode 3. The anode of the diode 3 is connected to the lowest potential (ground). Between the source of the PMOS transistor 2 and the lowest potential (ground), a junction capacitor 4 connected to the diode 3 in parallel in an equivalent circuit manner, is provided. The ground serves as a bypass for releasing a surge current.

A control terminal 5 is used to switch between a high potential state for applying a voltage higher than the threshold value of the gate voltage of the PMOS transistor 2, and a low potential state for applying a voltage lower than the threshold value of the gate voltage. The control terminal 5 is linked with a power source 10 of the internal circuit 100. When the power source 10 is turned ON, that is, the internal circuit 100 is in the operation state, the control terminal 5 is also turned on (high potential state), whereas when the power source 10 is turned OFF, that is, the internal circuit 100 is in the non-operation state, the control terminal 5 is also turned off (low potential state).

In this embodiment, more specifically, the control terminal 5 is connected to the power source 10 via a resistor 6, and is also grounded via a resistor 7. With this structure, therefore, the control terminal 5 is switched between the high and low potential states, along with the power source 10 of the internal circuit 100. However, the structure is not limited to that mentioned above, but the potential of the control terminal 5 can be switched, linked with the power source 10 in various modes.

when the control terminal is in the OFF state, the channel of the PMOS transistor 2 is rendered conductive. More specifically, the input/output terminal 1 and the internal circuit 100 are coupled with the diode 3 and the junction capacitor 4 via the transistor 2. In this state, when a negative surge voltage lower than the lowest potential (ground) is applied to the input/output terminal 1, the diode 3 is rendered in a forward bias state, and becomes conductive, thus preventing the application of a high negative voltage to the internal circuit 100. When a positive surge voltage is applied to the input/output terminal 1, the diode 3 is broken down, thus preventing the application of a voltage equal to or higher than the breakdown-proof voltage of the diode 3 to the internal circuit 100.

Further, in consideration of that a surge voltage is generated usually due to the charge accumulated in the external static capacitor, the surge voltage can be sufficiently lowered by increasing the static capacitance of the capacitor 4. Such a solution is based on the relationship v=Q/C, where v represents a surge voltage, Q represents a charge, and C represents a capacitance of the capacitor 4.

When the control terminal 5 is in the ON state, the channel of the PMOS transistor 2 disappears. Therefore, the input/output terminal 1 and the internal circuit 100 are released from the diode 3 and the junction capacitor 4. Consequently, the parasitic capacitance between the input/output terminal 1 and the internal circuit 100 will reduced to the capacitance of a small PN junction between the P drain of the PMOS transistor 2 and the back gate, that is, the N layer in the substrate.

In general, a static breakdown occurs during handling of an IC or a substrate in which an IC is mounted, and the static breakdown does not easily occur when the power of the internal circuit is ON. From this viewpoint, the protection circuit according to the present invention is designed such that the PMOS transistor 2 functions to electrically release the input/output terminal 1 and the internal circuit 100 from the diode 3 and the capacitor 4 while the internal circuit 100 is operating. Further, even when the control terminal 5 is ON, the input/output terminal 1 and the lowest potential (ground) do not make a short circuit, thereby avoiding a loss of signal charge.

FIG. 7 is a cross sectional view of a structure in which the protection circuit shown in FIG. 6 is realized on a semiconductor substrate, especially the sections corresponding to the PMOS transistor 2, the PN diode 3 and the junction capacitor 4.

An N-type buried layer 12 having a high impurity concentration is formed in a P-type silicon substrate. A P-type epitaxial layer 13 is formed on the N-type buried layer 12, and an N-type well layer 14 is formed in the surface thereof. In order to prepare an element isolation region, an insulating oxide film 15 is selectively formed so as to surround the N-type well layer 14. The surface of the N-type well layer 14 makes a region on which the PMOS transistor 2 is formed.

In order to make a depletion-type element, a channel region 16 assigned to the P-type is formed in the surface of the N-type well layer 14. A gate insulating oxide film 17 is formed on the upper surface of the channel region 16, and a gate electrode 18 made of polysilicon is formed on the upper surface of the gate oxide film 17. Other than the above-mentioned members, P-type drain and source layers 20 and 21 are also formed in the surface of the N-type well layer 14 so as to interpose the channel region 16 therebetween.

An N-type high impurity concentration layer 24 is formed in the surface of the N-type well layer 14 so as to be adjacent to the right side of the source 21. A CVD insulating film 22 serving as a protection layer is deposited on the upper surface of the N-type well layer 14 including the upper surface of the oxide film 15. Contact holes are formed in the insulating film 22 and the like, at positions corresponding to those of the drain layer 20, the gate electrode 18, the source layer 21 and the high impurity concentration layer 24. Electrode and wiring layers 23 are selectively formed so as to fill these contact holes, and thus electrodes 23a, 23c and 23b of the drain, gate and source, respectively, are formed. To the electrode 23a, the input/output terminal 1 and the internal circuit 100 are connected. The control terminal 5 is connected to the electrode 23c. The electrode 23b serves to short-circuit the source layer 21 with the high concentration layer 24 used for connection of the N-type well layer 14.

In the semiconductor protection device shown in FIG. 7, the PMOS transistor 2 shown in FIG. 6 includes the drain layer 20, the source layer 21, the gate electrode 18 and the like. The PN diode 3 and the junction capacitor 4 are formed by the PN junctions between the P-type substrate 11 and the N-type buried layer 12, between the N-type buried layer 12 and the P-type epitaxial layer 13, and between the P-type epitaxial layer 13 and the N-type well layer 14. Therefore, the area of the PN junction surface of the PN diode 3 can be expanded, and the static capacitance of the junction capacitor 4 can be increased. Particularly, in this embodiment, in order to increase the static capacitance of the junction capacitor 4, the N-type buried layer 12 is formed wider than the N-type well layer 14, and is actually expanded to a wiring region in the vicinity of the well layer 14.

Next, a method of manufacturing the semiconductor protection layer shown in FIG. 7 will be described.

An N-type buried layer 12 having an impurity concentration of $1\times10^{18}$ to $10^{19}$ cm$^{-3}$ and a thickness of 4 μm is formed by diffusion in a P-type silicon substrate 11 having a resistance of several tens Ω·cm. Then, the P-type epitaxial layer 13 is formed on the N-type buried layer 12 by epitaxial growth.

After the formation of the P-type epitaxial layer 13, phosphor ions are implanted in the surface region of the P-type epitaxial layer 13, and thermally diffused, thus forming an N-type well layer 14 having a dose amount of about $1\times10^{16}$ cm$^{-3}$. Next, the insulating oxide film 15 is formed by an LOCOS (local oxidation of silicon) method. Subsequently, the channel region 16 for determining the threshold voltage Vth of the PMOS transistor 2 is formed by ion-implantation of boron.

After the formation of the channel region 16, the gate insulating oxide film 17 is formed by oxidation. Then, a polysilicon film is formed above the surface of the N-type well layer 14 by the CVD (chemical vapor deposition) method, and the gate electrode 18 is formed on the upper surface of the gate oxide film 17 by the patterning process of lithography and etching.

Next, the N-type high impurity concentration layer 24 having a dose amount of about $1\times20^{20}$ cm$^{-3}$ and used for connection of the N-type well layer 14 is formed by ion-implantation of arsenic and thermal diffusion. Subsequently, the P-type drain and source layers 20 and 21 having a dose amount of $1\times10^{19}$ to $10^{20}$ cm$^{-3}$ are formed by ion-implantation of boron or BF$_2$ and thermal diffusion.

Then, the insulating layer 22 made of, for example, SiO$_2$, is deposited above the upper surface of the N-type well layer 14 including the upper surface of the selective oxide film 15 by the CVD method. Subsequently, contact holes are formed in the insulating film 22 and the like, and these holes are filled with the electrode and wiring layers 23 made of aluminum, thus forming electrodes 23a, 23c and 23b. The electrode 23b may be segmented and separately formed in the source layer 21 and the high impurity concentration layer 24 for connection of the N-type well layer 14, respectively, and these segments may be electrically connected to each other.

Figure 9:
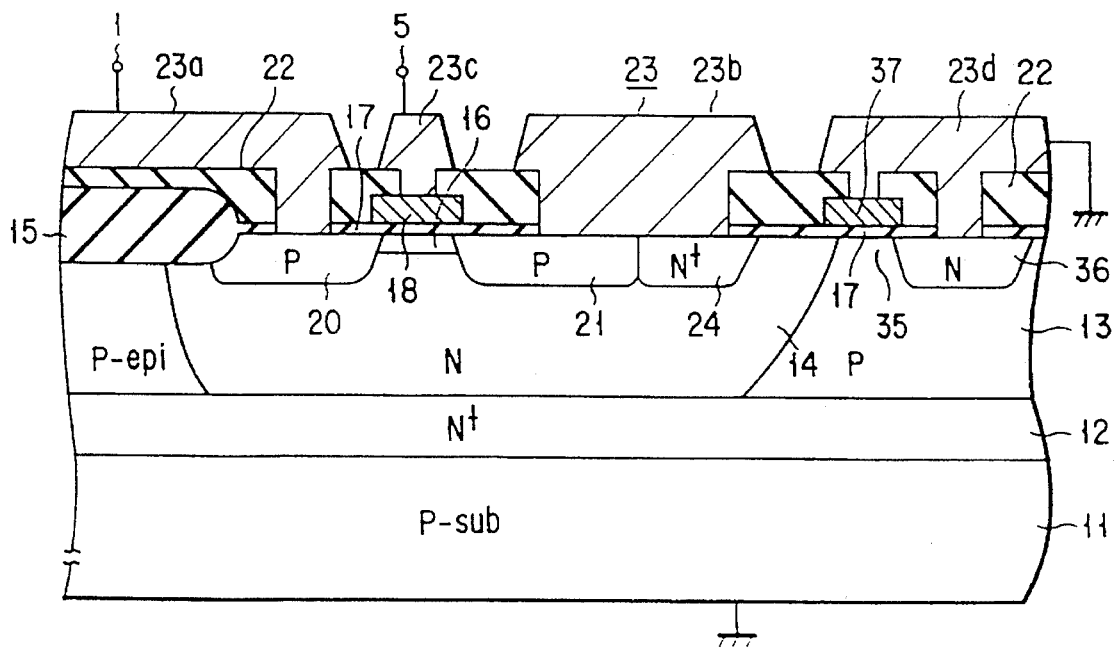
FIG. 9 is a cross sectional view showing a semiconductor protection device corresponding to the circuit shown in FIG. 8.

FIGS. 8 and 9 respectively illustrate a semiconductor protection circuit according to another embodiment of the present invention, and a semiconductor protection device corresponding to the circuit. In these figures, structural elements corresponding to those of the semiconductor protection circuit and the device shown in FIGS. 6 and 7 are designated by the same reference numerals, and the explanations therefor will be omitted.

In FIG. 8, an NMOS transistor 31 is used in place of the PN diode 3 shown in FIG. 6. The drain of the NMOS transistor 31 is connected to the source of the PMOS transistor 2, and the gate and source of the transistor 31 are connected to the lowest potential (ground).

In this embodiment also, when the internal circuit 100 is not in operation, the control terminal 5 is turned off, rendering the channel of the PMOS transistor 2 conductive. Therefore, the input/output terminal 1 and the internal circuit 100 are connected to the NMOS transistor 31 and the junction capacitor 4. In this state, when a negative surge voltage, which is lower than the lowest potential, is applied to the input/output terminal 1, the NMOS transistor 31 becomes conductive, thereby protecting the internal circuit 100. When a positive surge voltage is applied to the input/output terminal 1, the NMOS transistor 31 is broken down, thereby protecting the internal circuit 100. The ground serves as a bypass for releasing the surge current. The surge voltage is made sufficiently small by a large static capacitance of the capacitor 4.

During the operation of the internal circuit 100, the control terminal 5 is turned on, and the channel of the PMOS transistor 2 disappears. Therefore, the input/output terminal 1 and the internal circuit 100 are released from the NMOS transistor 31 and the junction capacitor 4. Consequently, the parasitic capacitance between the input/output terminal 1 and the internal circuit 100 is reduced.

In FIG. 9, an N-type source layer 36 is formed in the P-type epitaxial layer 13 so as to oppose to the N-type well layer 14 with a channel region 35 interposed therebetween, by diffusion of impurity. A gate electrode 37 is formed on the channel region 35 via a gate insulating oxide film 17. The gate electrode 37 is short-circuited with the source electrode 23d which is formed on the N-type source layer 36 and grounded. The NMOS transistor 31 shown in FIG. 8 consists of the N-type well layer 14 serving as a drain layer, a source layer 36, a gate electrode 37 and the like.

Figure 10:
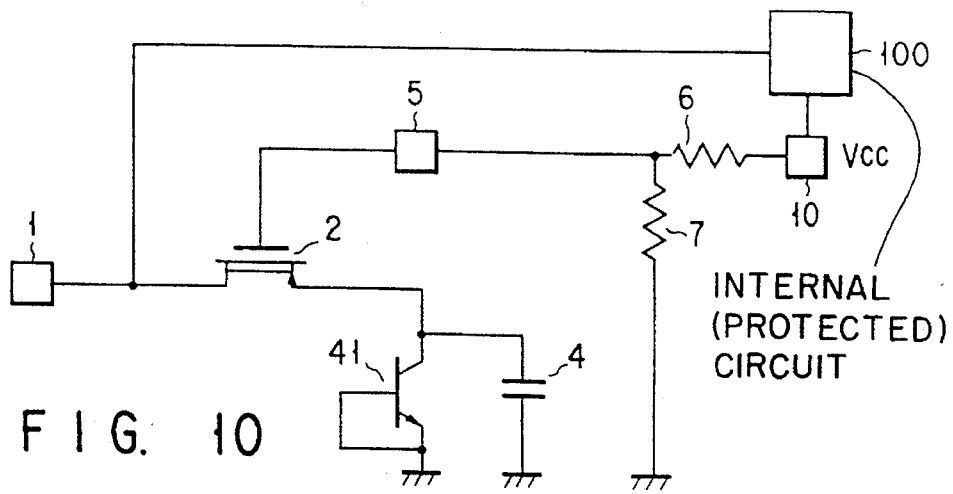
FIG. 10 is a semiconductor protection circuit according to still another embodiment of the present invention.
Figure 11:
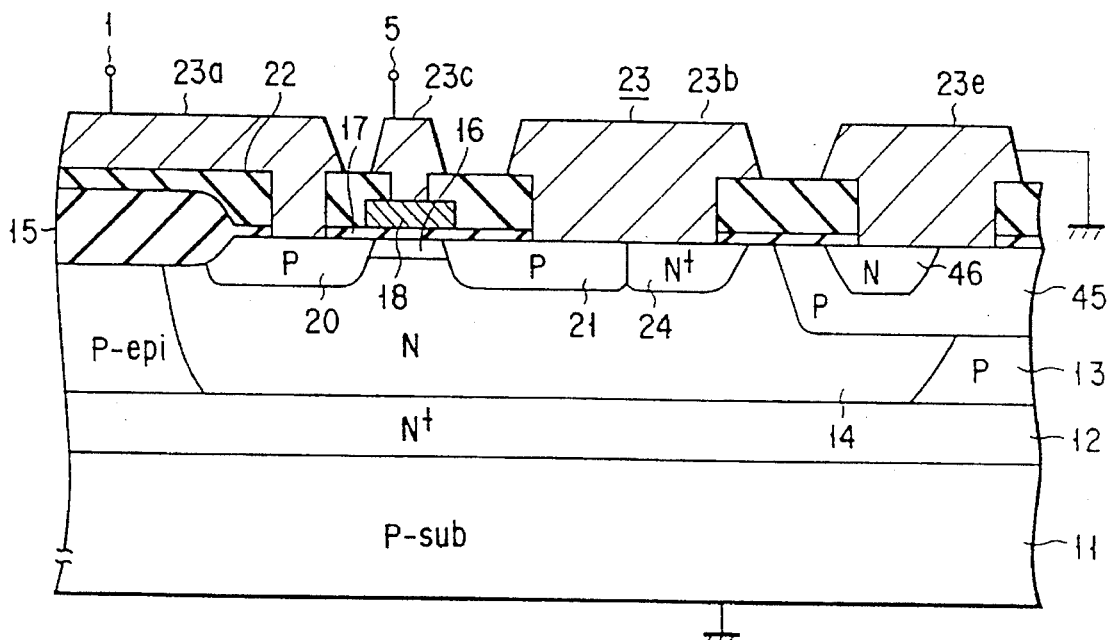
FIG. 11 is a cross sectional view showing a semiconductor protection device corresponding to the circuit shown in FIG. 10.

FIGS. 10 and 11 respectively illustrate a semiconductor protection circuit according to another embodiment of the present invention, and a semiconductor protection device corresponding to the circuit. In these figures, structural elements corresponding to those of the semiconductor protection circuit and the device shown in FIGS. 6 and 7 are designated by the same reference numerals, and the explanations therefor will be omitted.

In FIG. 10, an NPN bipolar transistor 41 is used in place of the PN diode 3 shown in FIG. 6. The collector of the bipolar transistor 41 is connected to the source of the PMOS transistor 2, and the base and emitter of the transistor 41 are connected to the lowest potential (ground).

In this embodiment also, when the internal circuit 100 is not in operation, the control terminal 5 is turned off, rendering the channel of the PMOS transistor 2 conductive. Therefore, the input/output terminal 1 and the internal circuit 100 are connected to the bipolar transistor 41 and the junction capacitor 4. In this state, when a negative surge voltage, which is lower than the lowest potential, is applied to the input/output terminal 1, the bipolar transistor 41 becomes conductive, thereby protecting the internal circuit 100. When a positive surge voltage is applied to the input/output terminal 1, the bipolar transistor 41 is broken down, thereby protecting the internal circuit 100. The ground serves as a bypass for releasing the surge current. The surge voltage is made sufficiently small by a large static capacitance of the capacitor 4.

During the operation of the internal circuit 100, the control terminal 5 is turned on, and the channel of the bipolar transistor 2 disappears. Therefore, the input/output terminal 1 and the internal circuit 100 are released from the bipolar transistor 41 and the junction capacitor 4. Consequently, the parasitic capacitance between the input/output terminal 1 and the internal circuit 100 is reduced.

In FIG. 11, an P-type base layer 45 is formed in the surfaces of the N-type well layer 14 and the P-type epitaxial layer 13 by diffusion of impurity. Further, an N-type emitter layer 46 is formed in the surface region of the P-type base layer 45 by diffusion of impurity. The P-type base layer 45 and the N-type emitter layer 46 are short-circuited with each other by the electrode 23e which is grounded. The bipolar transistor 41 shown in FIG. 10 consists of the N-type well layer 14 serving as a collector layer, a base layer 36, an emitter layer 46 and the like.

Figure 12:
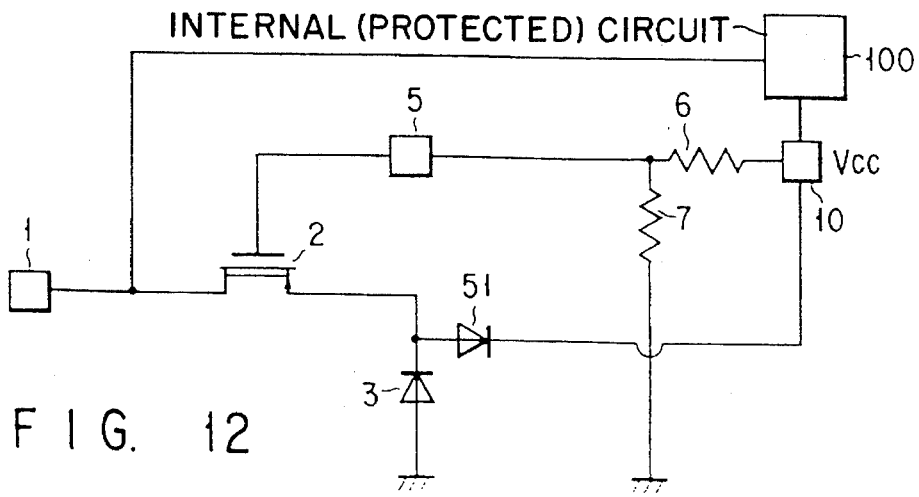
FIG. 12 is a semiconductor protection circuit according to still another embodiment of the present invention.

FIG. 12 illustrates a semiconductor protection circuit according to another embodiment of the present invention. In this figure, structural elements corresponding to those of the semiconductor protection circuit shown in FIG. 6 are designated by the same reference numerals, and the explanations therefor will be omitted.

In FIG. 12, a PN diode 51 is used such that the cathode of the PN diode 51 is connected to the power source 10 of a maximum voltage of vcc, and the anode thereof is connected to the source of the PMOS transistor 2.

In this embodiment also, when the internal circuit 100 is not in operation, the control terminal 5 is turned off, rendering the channel of the PMOS transistor 2 conductive. Therefore, the input/output terminal 1 and the internal circuit 100 are connected to the PN diodes 3 and 51. In this state, when a negative surge voltage, which is lower than the lowest potential, is applied to the input/output terminal 1, the PN diode 3 becomes conductive, thereby protecting the internal circuit 100. When a positive surge voltage higher than Vcc (maximum voltage) is applied to the input/output terminal 1, the PN diode 51 becomes conductive, thereby preventing the application of a voltage higher than Vcc to the internal circuit 100. The power source 10 serves as a bypass for releasing a positive surge current, whereas the ground serves as a bypass for releasing a negative surge current.

During the operation of the internal circuit 100, the control terminal 5 is turned on, and the channel of the PMOS transistor 2 disappears. Therefore, the input/output terminal 1 and the internal circuit 100 are released from the PN diodes 3 and 51. Consequently, the parasitic capacitance between the input/output terminal and the internal circuit 100 is reduced.

In the embodiments described above, the depletion-type PMOS transistor 2 is used as a switch for electrically releasing the input/output terminal 1 and the internal circuit 100 from the parasitic capacitance of the protection circuit. However, the present invention is not limited to such a structure. For example, in place of the PMOS transistor 2, a depletion-type NMOS transistor may be used to obtained the same effect. In this case, the control terminal 5 is in a low potential state when the power source 10 is turned on, that is, the internal circuit 100 is in operation, whereas the control terminal 5 is in a high potential state when the power source 10 is turned off, that is, the internal circuit 100 is not in operation.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor protection circuit for protecting a main semiconductor device from a surge voltage, comprising:

a depletion-type MOS transistor, one of a source and a drain of which is connected to an input/output terminal of said main semiconductor device;

a control terminal connected to a gate of said depletion-type MOS transistor, said control terminal applying one of first and second potentials, selected in accordance with switching between an operation state and a non-operation state of said main semiconductor device, to said gate, and said first and second potentials rendering a channel of said depletion-type MOS transistor non-conductive or conductive, respectively;

a bypass for releasing a surge current when a surge voltage is applied to said input/output terminal;

semiconductor rectifying means for connecting the other of said source and drain of said depletion-type MOS transistor to said bypass; and a capacitor connected in parallel with said rectifying means, for connecting said other of said source and drain of said depletion-type MOS transistor to said bypass.

2. The circuit according to claim 1, wherein said rectifying means is rendered conductive when said surge voltage of a first polarity is applied to said input/output terminal, and is broken down when a surge voltage of a second polarity, which is opposite to said first polarity, is applied thereto.

3. The circuit according to claim 1, wherein said rectifying means comprises a PN diode.

4. The circuit according to claim 1, wherein said rectifying means comprises an MOS transistor.

5. The circuit according to claim 1, wherein said rectifying means comprises a bipolar transistor.

6. The circuit according to claim 1, wherein said bypass is grounded.

* * * * *